United States Patent
Hong et al.

(10) Patent No.: US 9,905,796 B2
(45) Date of Patent: Feb. 27, 2018

(54) DISPLAY APPARATUS

(71) Applicant: SAMSUNG DISPLAY CO., LTD., Yongin-si, Gyeonggi-do (KR)

(72) Inventors: Sangmin Hong, Yongin-si (KR); Sucheol Gong, Yongin-si (KR); Jungi Youn, Yongin-si (KR); Goeun Lee, Yongin-si (KR); Soukjune Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/862,014

(22) Filed: Sep. 22, 2015

(65) Prior Publication Data
US 2016/0276620 A1  Sep. 22, 2016

(30) Foreign Application Priority Data
Mar. 20, 2015 (KR) .................. 10-2015-0039028

(51) Int. Cl.
*H01L 51/52* (2006.01)
(52) U.S. Cl.
CPC .............. *H01L 51/5243* (2013.01)
(58) Field of Classification Search
None
See application file for complete search history.

(56) References Cited

U.S. PATENT DOCUMENTS

| | | | | |
|---|---|---|---|---|
| 7,795,616 | B2* | 9/2010 | Yamazaki | G02F 1/13458 257/57 |
| 2002/0012083 | A1* | 1/2002 | Tanaka | G02F 1/133514 349/106 |
| 2002/0024096 | A1* | 2/2002 | Yamazaki | H01L 27/32 257/359 |
| 2004/0137142 | A1* | 7/2004 | Nishikawa | H01L 27/3276 427/66 |
| 2005/0139820 | A1 | 6/2005 | Park | |
| 2005/0189878 | A1* | 9/2005 | Shitagami | H01L 51/525 313/512 |
| 2005/0247938 | A1* | 11/2005 | Okamoto | H01L 27/12 257/59 |
| 2009/0268145 | A1* | 10/2009 | Anjo | G02F 1/134363 349/141 |

(Continued)

FOREIGN PATENT DOCUMENTS

| KR | 10-2005-0034312 A | 4/2005 |
|---|---|---|
| KR | 10-2005-0068866 A | 7/2005 |
| KR | 10-2007-0033228 A | 3/2007 |

(Continued)

*Primary Examiner* — Lex Malsawma
(74) *Attorney, Agent, or Firm* — Lewis Roca Rothgerber Christie LLP (57) ABSTRACT

A display apparatus includes a first substrate; a display device including a display portion and located on the first substrate; a second substrate located above the display device; a sealing portion between the first substrate and the second substrate, and surrounding the display portion, the sealing portion bonding the first substrate and the second substrate; a circuit portion located between the sealing portion and the display portion; and one or more supplement members located between the circuit portion and the sealing portion so as to absorb an external shock delivered to the sealing portion.

7 Claims, 4 Drawing Sheets

(56) References Cited

U.S. PATENT DOCUMENTS

2010/0109516 A1   5/2010  Warashina et al.
2012/0235170 A1*  9/2012  Lee .......................... H01J 9/24
                                                    257/88

FOREIGN PATENT DOCUMENTS

| KR | 10-2009-0121500 A | 11/2009 |
| KR | 10-2009-0128431 A | 12/2009 |
| KR | 10-2011-0020613 A |  3/2011 |
| KR | 10-2012-0136697 A | 12/2012 |

* cited by examiner

DISPLAY APPARATUS

CROSS-REFERENCE TO RELATED APPLICATION

This application claims priority to and the benefit of Korean Patent Application No. 10-2015-0039028, filed on Mar. 20, 2015, in the Korean Intellectual Property Office, the disclosure of which is incorporated herein by reference in its entirety.

BACKGROUND

1. Field

One or more exemplary embodiments relate to a display apparatus.

2. Description of the Related Art

Display apparatuses, such as an organic light-emitting display apparatus including a thin-film transistor (TFT), are highlighted because they can be applied to displays of mobile apparatuses such as smartphones, tablet personal computers (PCs), ultra-slim notebooks, digital cameras, video cameras, and portable information terminals, or can be applied to electronic/electric products, such as ultra-slim televisions (TVs).

To protect an organic light-emitting device of an organic light-emitting display apparatus from external damage, a gap between upper and lower substrates has to be sealed. To do so, a sealing member is interposed between the upper and lower substrates, and a predetermined energy is applied thereto so as to melt the sealing member, so that the upper and lower substrates are bonded. Here, it is necessary to maintain a structural strength of the sealed part.

SUMMARY

Additional aspects will be set forth in part, in the description which follows and, in part, will be apparent from the description, or may be learned by practice of the presented embodiments.

According to an aspect of one or more exemplary embodiments, a display apparatus includes a first substrate; a display device including a display portion and located on the first substrate; a second substrate on the display device; a sealing portion between the first substrate and the second substrate, and surrounding the display portion, the sealing portion bonding the first substrate and the second substrate; a circuit portion between the sealing portion and the display portion; and one or more supplement members between the circuit portion and the sealing portion, and configured to absorb an external shock delivered to the sealing portion.

The supplement members may be band shaped and extend along a longitudinal direction of the sealing portion.

The supplement members may be pin shaped and located along a longitudinal direction of the sealing portion.

A part of the supplement members may contact a part of the sealing portion.

The supplement members may include a metal layer including a metal, an alloy, or a combination thereof.

A width of one of the supplement members may be equal to or greater than about 2.3 µm.

A thickness of one of the supplement members may be equal to or less than about 18,200 Å.

The supplement members may include a first supplement member and a second supplement member, the first supplement member and the second supplement member being spaced from each other by a set distance along a width direction of the display apparatus.

The set distance between the first supplement member and the second supplement member may be equal to or greater than 2.5 µm.

Each of the first supplement member and the second supplement member may include a band shaped supplement member extending along a longitudinal direction of the sealing portion, or a plurality of pin shaped supplement members located along the longitudinal direction of the sealing portion.

Each of the first supplement member and the second supplement member may include the plurality of the pin shaped supplement members located along the longitudinal direction of the sealing portion, the pin shaped the first supplement member and the pin shaped the second supplement member are alternately located along the longitudinal direction of the sealing portion.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

The inventive concept will now be described more fully with reference to the accompanying drawings, in which exemplary embodiments of the inventive concept are shown. The inventive concept may, however, be embodied in many different forms and should not be construed as being limited to the embodiments set forth herein. Rather, these embodiments are provided so that this disclosure will be thorough and complete, and will fully convey the inventive concept to those of ordinary skill in the art. In the drawings, a size of each element may be exaggerated or reduced for clarity. For example, the sizes and thicknesses of elements in drawings are shown for convenience of description, and are not limited thereto.

While terms "first," "second," etc. are used to describe various components, the components are not limited to the terms "first," "second," etc. The terms "first," "second," etc. are used only to distinguish between each of the components.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify the existence of a recited form, a number, a process, an operation, a component, a part, and/or groups thereof, while not excluding the existence of one or more other recited forms, one or more other numbers, one or more other processes, one or more other operations, one or more other components, one or more other parts, and/or groups thereof.

It will be understood that when a layer, a film, a region, a plate, or the like is referred to as being "on" another layer, film, region, or plate, the layer, film, region, or plate can be directly on another layer, film, region, or plate, or one or more intervening layers, films, regions, or plates may also be present.

Spatially relative terms, such as "beneath," "below," "lower," "under," "above," "upper," and the like, may be used herein for ease of explanation to describe one element's or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees, or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

As used herein, the term "and/or" includes any and all combinations of one or more of the associated listed items. Expressions such as "at least one of," when preceding a list of elements, modify the entire list of elements, and do not modify the individual elements of the list.

As used herein, the term "substantially," "about," and similar terms are used as terms of approximation, and are not used as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Figure 1:
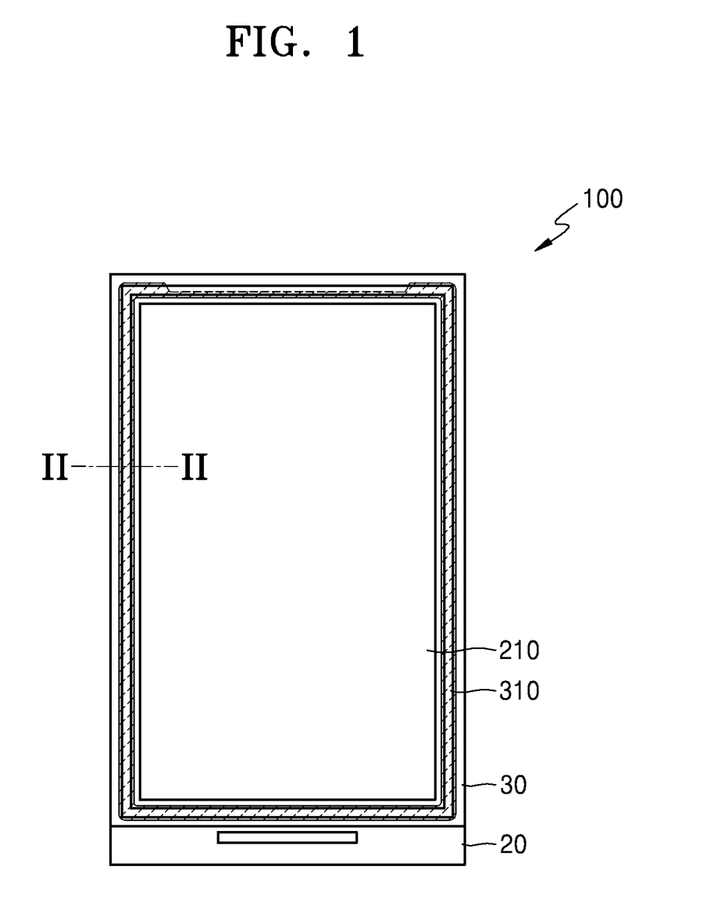
FIG. 1 is a plan view illustrating a display apparatus according to an exemplary embodiment.
Figure 2:
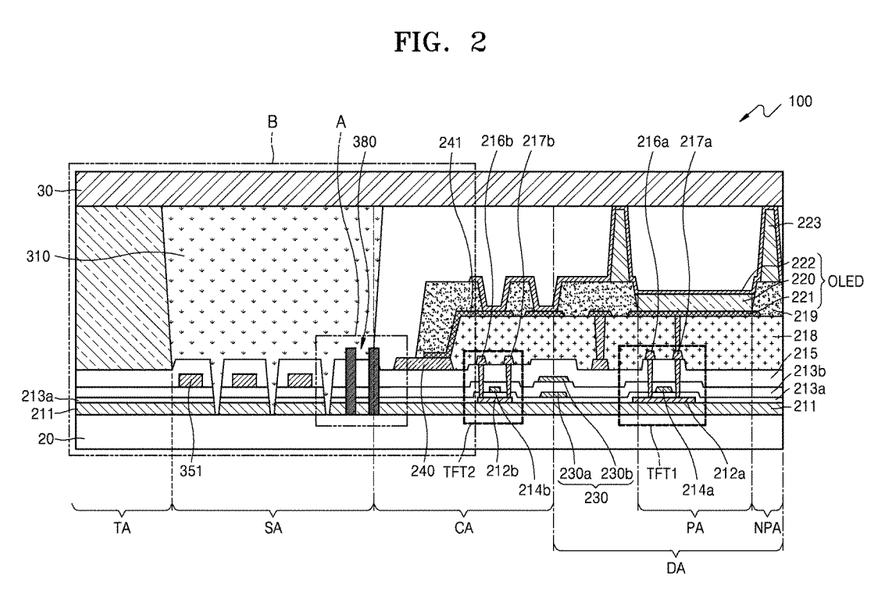
FIG. 2 is a cross-sectional view of the display apparatus taken along the line II-II of FIG. 1.

FIG. 1 is a plan view illustrating a display apparatus 100, according to an exemplary embodiment. FIG. 2 is a cross-sectional view of the display apparatus 100, taken along the line II-II of FIG. 1.

In the present exemplary embodiment, the display apparatus 100 is formed as an organic light-emitting display apparatus, but is not limited thereto, and thus may be another type of display apparatus, such as a liquid crystal display (LCD) apparatus, a field emission display apparatus, an electronic paper display (EPD) apparatus, etc. all of which being able to realize (e.g., display) an image by having power applied thereto.

Referring to FIGS. 1 and 2, the display apparatus 100 includes a first substrate 20, a second substrate 30 arranged to face the first substrate 20, and a sealing member 310 located between the first substrate 20 and the second substrate 30 so as to bond the first substrate 20 to the second substrate 30.

A display device 210 is formed on the first substrate 20. The first substrate 20 may be a glass substrate, a polymer substrate, a film having flexibility, a metal substrate, or a composite substrate thereof. The display device 210 includes an organic light-emitting device, a LCD, or an electrophoretic display device capable of realizing an image.

The display apparatus 100 includes a display portion DA for displaying an image, a sealing portion SA for sealing the display portion DA, and a cutting portion TA for providing an area to cut the display apparatus 100 (e.g., during manufacture) into an individual display apparatus.

A buffer layer 211 may be further formed on the first substrate 20. The buffer layer 211 may prevent ion impurities from diffusing on a top surface of the first substrate 20, may prevent penetration of external moisture or air, and may planarize the top surface. In some embodiments, the buffer layer 211 may be formed of an inorganic material including silicon oxide, silicon nitride, silicon oxynitride, aluminum oxide, aluminum nitride, titanium oxide, titanium nitride, etc., an organic material including polyimide, polyester, acryl, etc., and/or a multi-stack of the inorganic material and the organic material. The buffer layer 211 is an optional element, and thus may be omitted. The buffer layer 211 may be formed by using various deposition methods including a plasma enhanced chemical vapor deposition (PECVD) method, an atmospheric pressure CVD (APCVD) method, a low pressure CVD (LPCVD) method, and/or the like.

The display device 210 for realizing an image is arranged in the display portion DA. The display device 210 may be an organic light-emitting device, an LCD, or an electrophoretic display device. Referring to FIG. 2, it is assumed that the display device 210 is an organic light-emitting device OLED, but one or more exemplary embodiments are not limited thereto.

A first thin-film transistor TFT1 includes a first active layer 212a, a first gate electrode 214a, a first source electrode 216a, and a first drain electrode 217a. A first gate insulating layer 213a may be interposed between the first gate electrode 214a and the first active layer 212a so as to insulate the first gate electrode 214a from the first active layer 212a. The first gate electrode 214a may be formed on the first gate insulating layer 213a so as to overlap with a portion of the first active layer 212a. The thin-film transistor TFT1 is located below the organic light-emitting device OLED, and may be a driving thin-film transistor for driving the organic light-emitting device OLED.

A second thin-film transistor TFT2 includes a second active layer 212b, a second gate electrode 214b, a second source electrode 216b, and a second drain electrode 217b. The first gate insulating layer 213a may be interposed between the second gate electrode 214b and the second active layer 212b so as to insulate the second gate electrode 214b from the second active layer 212b. The second gate electrode 214b may be formed on the first gate insulating layer 213a so as to overlap with a portion of the second active layer 212b.

The first active layer 212a and the second active layer 212b may be formed on the buffer layer 211. The first active layer 212a and the second active layer 212b may be formed of an inorganic semiconductor material, such as amorphous silicon or polysilicon or an organic semiconductor material. In some embodiments, the first active layer 212a may be formed of an oxide semiconductor material. For example, the oxide semiconductor material may include an oxide of materials selected from Groups 12, 13, and/or 14 metal elements including zinc (Zn), indium (In), gallium (Ga), tin (Sn), cadmium (Cd), germanium (Ge), and hafnium (Hf), and/or a combination thereof.

The first gate insulating layer 213a is formed on the buffer layer 211 and covers the first active layer 212a and the second active layer 212b. A second gate insulating layer 213b covers the first gate electrode 214a and the second gate electrode 214b.

Each of the first gate electrode 214a and the second gate electrode 214b may be formed as a single layer, or may be formed as multiple layers including Au, Ag, Cu, Ni, Pt, Pd, Al, Mo, or Cr, and/or a metal alloy such as Al:Nd alloy and/or a Mo:W alloy.

Each of the first gate insulating layer 213a and the second gate insulating layer 213b may be formed as a single inorganic layer, or may be formed as multiple inorganic layers including silicon oxide, silicon nitride, and/or metal oxide.

An interlayer insulating layer 215 is formed on the second gate insulating layer 213b, and may be formed as an inorganic layer including silicon oxide and/or silicon nitride. The interlayer insulating layer 215 may include an organic material.

The first source electrode 216a and the first drain electrode 217a are formed on the interlayer insulating layer 215. The first source electrode 216a and the first drain electrode 217a contact the first active layer 212a via respective contact holes. Also, the second source electrode 216b and the second drain electrode 217b are formed on the interlayer insulating layer 215, and contact the second active layer 212b via respective contact holes. Each of the first source electrode 216a, the second source electrode 216b, the first drain electrode 217a, and the second drain electrode 217b may include a metal material, an alloy, metal nitride, conductive metal oxide, and/or a transparent conductive material.

A structure of each of the first thin-film transistor TFT1 and the second thin-film transistor TFT2 is not limited to the aforementioned structure, and various thin-film transistor structures may be applied thereto. For example, each of the first thin-film transistor TFT1 and the second thin-film transistor TFT2 is depicted as having a top gate structure. In other embodiments, however, the thin-film transistors TFT1 and TFT2 may have a bottom gate structure in which the first gate electrode 214a is located below the first active layer 212a.

The display portion DA may include a capacitor 230. The capacitor may store a data signal to be supplied to the display device 210, or may be used to compensate for a voltage drop of the display device 210.

The capacitor 230 may include a first capacitor electrode 230a, a second capacitor electrode 230b, and the second gate insulating layer 213b formed therebetween. The first capacitor electrode 230a may be formed of a same material as the second gate electrode 214b, and the second capacitor electrode 230b may be formed of a same material as the first gate electrode 214a.

A planarization layer 218 covers the capacitor 230 and the first and second thin-film transistors TFT1 and TFT2, and is formed on the interlayer insulating layer 215. The planarization layer 218 may remove and/or planarize a step difference between layers so as to increase a luminescent efficiency of the organic light-emitting device OLED. Also, the planarization layer 218 may have a through hole for exposing a portion of the first drain electrode 217a.

The planarization layer 218 may be formed as an insulation member. For example, the planarization layer 218 may have a single-layer structure or a multi-layer structure including an inorganic material, an organic material, and/or a composite of the inorganic material and the organic material, and may be formed by using various deposition methods. In some embodiments, the planarization layer 218 may include at least one material from among a polyacrylates resin, an epoxy resin, a phenolic resin, a polyamides resin, a polyimides rein, an unsaturated polyesters resin, a poly phenylenethers resin, a poly phenylenesulfides resin, and/or benzocyclobutene (BCB).

However, one or more exemplary embodiments are not limited thereto, and in some embodiments, one of the planarization layer 218 and the interlayer insulating layer 215 may not be formed.

The organic light-emitting device OLED is located on the planarization layer 218, and includes a first electrode 221, an intermediate layer 220 including an organic emission layer, and a second electrode 222. A pixel-defining layer 219 covers portions of the planarization layer 218 and the first electrode 221, and defines a pixel area PA and a non-pixel area NPA.

A hole and an electron respectively provided from the first electrode 221 and the second electrode 222 of the organic light-emitting device OLED may be combined in the organic emission layer of the intermediate layer 220, so that light may be generated.

The intermediate layer 220 may include the organic emission layer. In another exemplary embodiment, the intermediate layer 220 includes the organic emission layer, and may further include at least one of a hole injection layer, a hole transport layer, an electron transport layer, and/or an electron injection layer. However, the present exemplary embodiment is not limited thereto, and thus, the intermediate layer 220 includes the organic emission layer, and may further include various functional layers.

The second electrode 222 is formed on the intermediate layer 220. The second electrode 222 and the first electrode 221 generate an electric field so as to emit light from the intermediate layer 220. The first electrode 221 may be patterned in each pixel, and the second electrode 222 may be formed as a common electrode to concurrently apply a common voltage to all pixels. The second electrode 222 may be electrically connected, via a circuit line 241, to a power line 240 that is located at an end of a display portion DA.

Each of the first electrode 221 and the second electrode 222 may be formed as a transparent electrode or a reflective electrode. The first electrode 221 may function as an anode electrode, and the second electrode 222 may function as a cathode electrode, although their functions are not limited thereto. For example, the first electrode 221 may instead function as a cathode electrode, and the second electrode 222 may function as an anode electrode.

Although one organic light-emitting device OLED is illustrated in the drawings, the display portion DA may include a plurality of the organic light-emitting devices OLED. The respective organic light-emitting devices OLED may form corresponding pixels, and each of the pixels may realize a red color, a green color, a blue color, or a white color.

A protective layer may be formed on the second electrode 222, and may protect the organic light-emitting device OLED by covering the organic light-emitting device OLED. The protective layer may be formed as an inorganic insulating layer and/or an organic insulting layer.

A spacer 223 is located between the first substrate 20 and the second substrate 30 to maintain a space between first substrate 20 and the second substrate 30. The spacer 223 may be arranged to prevent a display characteristic from deteriorating due to an external shock.

In some embodiments, the spacer 223 is formed on the pixel-defining layer 219. The spacer 223 may project (or extend) from the pixel-defining layer 219 toward the second substrate 30. In some embodiments, the pixel-defining layer 219 and the spacer 223 may be integrally formed by a photolithography process or by a photo-etching process using a photoresist material. That is, the pixel-defining layer 219 and the spacer 223 may be simultaneously formed by adjusting an exposure dose, in an exposure process, by using a halftone mask.

The second electrode 222 and/or the protective layer may be located on the spacer 223.

Various circuit patterns may be formed in a circuit portion CA. For example, a power supply pattern, an antistatic pattern, and other various circuit patterns.

In the present exemplary embodiment, the circuit line 241 is formed in the circuit portion CA, and may be formed on the planarization layer 218. The circuit line 241 may be formed of a same material as the first electrode 221, and may be electrically connected to the second electrode 222 of the organic light-emitting device OLED.

The circuit line 241 is connected to the power line 240. The power line 240 may be formed on the interlayer insulating layer 215, and may be formed of a same material as the first source electrode 216a, as the second source electrode 216b, as the first drain electrode 217a, and as the second drain electrode 217b. The power line 240 may receive power from an external source.

The second substrate 30 may be formed of a transparent material, such that an image realized by the display device 210 may be externally exposed via the second substrate 30. In some embodiments, the second substrate 30 may further include an on-cell touch screen panel whereon a touch screen pattern is formed, so that the second substrate 30 may function as a touch panel.

A polarizing film, a color filter, or a protective window may be further arranged on the second substrate 30.

In the sealing portion SA, the sealing member 310 is located to surround the display device 210 between the first substrate 20 and the second substrate 30, and seals an internal space S between the first substrate 20 and the second substrate 30. The sealing member 310 prevents oxygen or moisture from penetrating into the internal space S in which the display device 210 is formed. Also, the sealing member 310 may stably bond the first substrate 20 and the second substrate 30, and thus may improve a mechanical strength. An absorbent or a filling material may be arranged in the internal space between the first substrate 20 and the second substrate 30.

The sealing member 310 may be formed of an inorganic material. For example, the sealing member 310 may be a glass frit. The sealing member 310 may be formed via a coating process utilizing a dispenser or a screen printing method. In some embodiments, the glass frit includes a powder-type glass material, but the inventive concept is not limited thereto, and may include a paste state in which a laser or infrared ray absorber, an organic binder, a filler for reducing a thermal expansion coefficient, and/or the like are mixed with a main material such as $SiO_2$. When a laser beam is irradiated to the sealing member 310, the sealing member 310 is melted and hardened, and the first substrate 20 and the second substrate 30 may be bonded to each other.

For example, according to a vacuum packaging method using a laser, to bond the first substrate 20 and the second substrate 30 by using the sealing member 310, the sealing member 310 having a set (e.g., a predetermined) thickness (e.g., a glass frit) is sprayed along an edge of the first substrate 20, and is pre-fired by having heat applied thereto, so that a binder component in the glass frit is removed. Afterward, the second substrate 30 is aligned on the first substrate 20, and when the first substrate 20 and the second substrate 30 are placed inside a vacuum-state firing furnace to be heated to an appropriate or suitable temperature equal to or less than a melting temperature of the glass frit, only a part of the first substrate 20 where the glass frit is sprayed is heated by a laser beam, so that the glass frit is melted and thus the first substrate 20 and the second substrate 30 may be bonded to each other.

While the vacuum packaging method using a laser is being performed, when the laser beam melts the sealing member 310, a plurality of bubbles may be generated. During the pre-firing process, a depth of about 30 μm to about 40 μm of a bubble generating source, such as moisture or the binder component, is removed from a surface of the sealing member 310, but the bubble generating source may not be sufficiently removed, and may remain inside the sealing member 310, such that, when the sealing member 310 is melted, the plurality of bubbles may be generated. To prevent decreasing the available bonding area, while the sealing process using the laser beam is performed, heat is applied to a lower portion of the sealing member 310 where many of the bubbles accumulate. By doing so, the bubbles may be removed, or may rise to an upper portion. A heating member 351 for applying heat to the lower portion of the sealing member 310 is located on the second gate insulating layer 213b. The heating member 351 is formed as a heating element capable of applying heat to the lower portion of the sealing member 310. For example, the heating member 351 may include a heating part formed of a high resistive metal, and may include an electrode part located at both ends of the heating part and configured to apply a voltage to the heating part.

When an external shock is applied to the display apparatus 100 via the second substrate 30, the external shock may be delivered from a shock point in a radial direction along the second substrate 30. Here, the external shock delivered along the second substrate 30 may be focused in a boundary area between the sealing portion SA and the circuit portion CA, such that a mechanical strength property of the display apparatus 100 may deteriorate.

Figure 3:
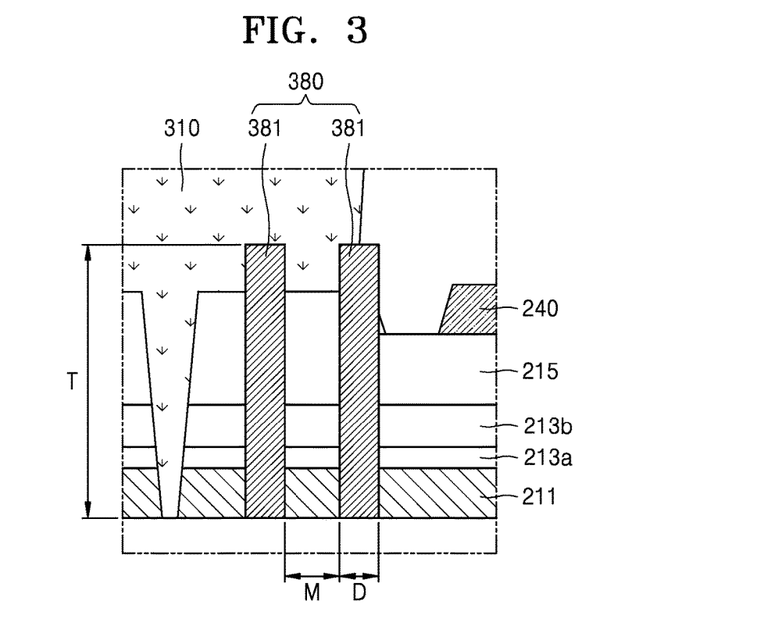
FIG. 3 illustrates a magnified cross-sectional view of region A in FIG. 2.

A supplement member 380 is a shock reducing member to prevent (or reduce) the external shock, which is delivered along the second substrate 30, from being delivered to the boundary area between the sealing portion SA and the circuit portion CA. To prevent the external shock from being delivered to the boundary area between the sealing portion SA and the circuit portion CA, the supplement member 380 may be located at the boundary area between the sealing portion SA and the circuit portion CA, so that the supplement member 380 may absorb the external shock delivered along the second substrate 30. With reference to FIG. 3, the supplement member 380 is described in detail.

Figure 4:
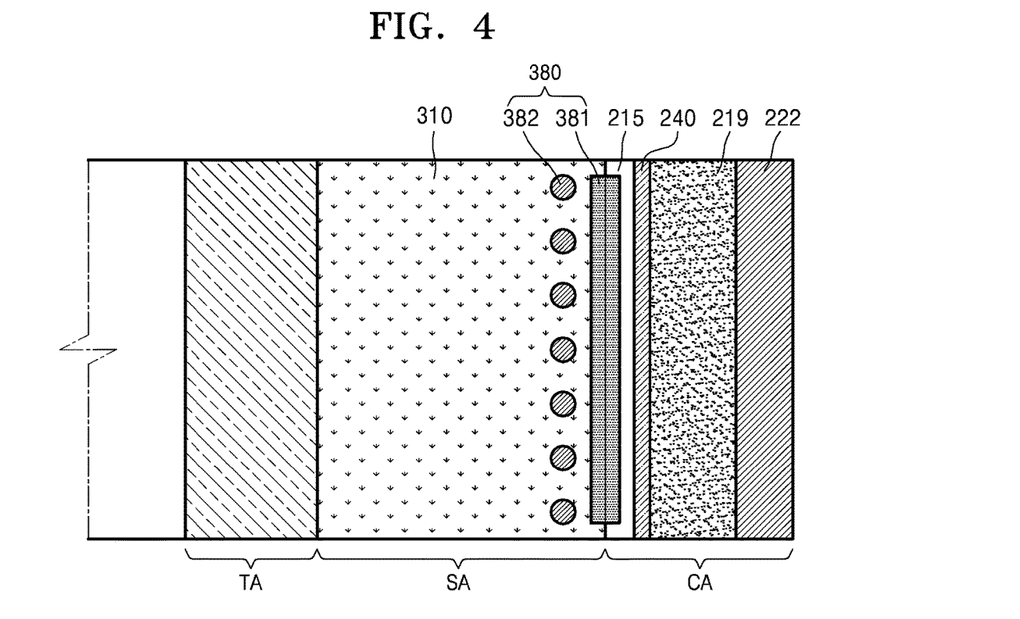
FIG. 4 illustrates a plan view of region B in FIG. 2 according to an exemplary embodiment.
Figure 5:
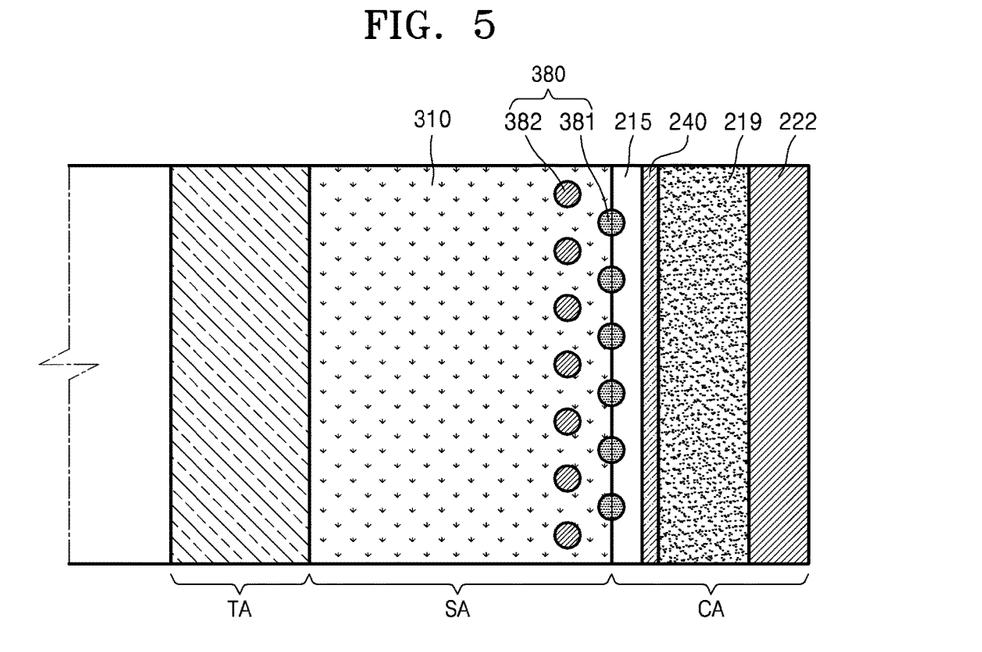
FIG. 5 illustrates a plan view of region B in FIG. 2 according to another exemplary embodiment.

FIG. 3 illustrates a magnified cross-sectional view of region A in FIG. 2. FIGS. 4 and 5 illustrate plan views of region B in FIG. 2, according to exemplary embodiments.

Referring to FIGS. 2, 3, and 4, the supplement member 380 may be formed along the boundary area between the sealing portion SA and the circuit portion CA to absorb the external shock delivered along the second substrate 30. For example, the supplement member 380 may be located between the sealing member 310 and the power line 240. In more detail, the supplement member 380 having a band shape may extend in a longitudinal direction of the sealing portion SA, in which the sealing member 310 is located. Alternatively, a plurality of the supplement members 380 having a pin shape may be located in the longitudinal direction of the sealing portion SA. Here, the supplement member 380 may contact the sealing member 310 and be spaced from the power line 240, or may be spaced from the sealing member 310 and the power line 240.

The supplement member 380 may be formed of a metal, an alloy, or a combination thereof. For example, the supplement member 380 may be formed of a same material as the power line 240 (e.g., may be formed as a single layer or may be formed as multiple layers including Au, Ag, Cu, Ni, Pt, Pd, Al, Mo, and/or Cr, and/or a metal alloy such as Al:Nd alloy and/or a Mo:W alloy), although the inventive concept is not limited thereto.

The supplement member 380 (e.g., a portion of the supplement member, or a first supplement member 381) may have a width D between the sealing portion SA and the circuit portion CA to prevent the sealing portion SA and the first substrate 20, i.e., the sealing member 310 and the interlayer insulating layer 215, from being spaced apart from each other due to the external shock. In the present exemplary embodiment, the interlayer insulating layer 215 is located below the sealing member 310 but one or more exemplary embodiments are not limited thereto. A random layer-structure may be located below the sealing member 310, and the supplement member 380 may absorb a shock from the outside so as to prevent the sealing member 310 and the random layer-structure from being spaced apart.

According to the present exemplary embodiment, the supplement member 380 may have the width D equal to or greater than 2.3 µm and may be formed on the first substrate 20 while the supplement member 380 has a thickness T equal to or less than 18,200 Å. However, one or more exemplary embodiments are not limited thereto, and the width D and the thickness T of the supplement member 380 may be determined according to a strength of the external shock. According to the thickness T of the supplement member 380, the supplement member 380 may not be located on the first substrate 20 but may be located on the buffer layer 211, the first gate insulating layer 213a, the second gate insulating layer 213b, or the interlayer insulating layer 215.

Also, the supplement member 380 may be plural in number, with a larger number making the supplement member 380 more effective against a stronger external shock. According to the present exemplary embodiment, a first supplement member 381 and a second supplement member 382 may be spaced from each other by having a distance M of about at least 2.5 µm arranged therebetween. As described above, because the supplement member 380 having a band shape or the plurality of the supplement members 380 having a pin shape may be formed while extending in the longitudinal direction of the sealing portion SA, the first supplement member 381 and the second supplement member 382 may have one of the band shape or the pin shape. For example, if the first supplement member 381 and the second supplement member 382 have the pin shape, the first supplement member 381 and the second supplement member 382 may cross each other along the longitudinal direction of the sealing portion SA. That is, as illustrated in FIG. 5, a pin shape 381-1 of the first supplement member 381 and a pin shape 382-1 of the second supplement member 382 cross each other along the longitudinal direction of the sealing portion SA, the external shock from the outside may be blocked along the longitudinal direction of the sealing portion SA.

As described above, in the display apparatus according to the one or more of the above exemplary embodiments, it is possible to prevent an external shock from being delivered to the sealing member, so that adhesion of the upper and lower substrates may be improved and thus a lifetime and reliability of the display apparatus may be improved.

While one or more exemplary embodiments have been described with reference to the figures, it will be understood by those of ordinary skill in the art that various changes in form and details may be made therein without departing from the spirit and scope as defined by the following claims and their equivalents.

What is claimed is:

1. A display apparatus comprising:
    a first substrate;
    a display device comprising a display portion and located on the first substrate;
    a second substrate on the display device;
    a sealing portion between the first substrate and the second substrate, and surrounding the display portion, the sealing portion bonding the first substrate and the second substrate;
    a circuit portion between the sealing portion and the display portion; and
    a first supplement member and a second supplement member between the circuit portion and the sealing portion, the first supplement member and the second supplement member being spaced from each other by a set distance along a width direction of the sealing portion, each of the first supplement member and the second supplement member comprising a plurality of pin shaped supplement members located along a longitudinal direction of the sealing portion, the pin shaped first supplement member and the pin shaped second supplement member being alternately located along the longitudinal direction of the sealing portion.

2. The display apparatus of claim 1, wherein a part of the supplement members contacts a part of the sealing portion.

3. The display apparatus of claim 1, wherein the supplement members comprise a metal layer comprising a metal, an alloy, or a combination thereof.

4. The display apparatus of claim 1, wherein a width of one of the supplement members is equal to or greater than about 2.3 µm.

5. The display apparatus of claim 1, wherein a thickness of one of the supplement members is equal to or less than about 18,200 Å.

6. The display apparatus of claim 1, wherein the set distance between the first supplement member and the second supplement member is equal to or greater than 2.5 µm.

7. The display apparatus of claim 1, wherein each of the first supplement member and the second supplement member comprise a band shaped supplement member extending along a longitudinal direction of the sealing portion, or a plurality of pin shaped supplement members spaced from each other along the longitudinal direction of the sealing portion.

* * * * *